United States Patent
Rogers

[11] Patent Number: 5,982,232
[45] Date of Patent: Nov. 9, 1999

[54] LOW NOISE, BANDWIDTH COMPENSATED TRANSIMPEDANCE AMPLIFIER

[75] Inventor: Dennis L. Rogers, Croton on Hudson, N.Y.

[73] Assignee: International Business Machines Corporation, Armonk, N.Y.

[21] Appl. No.: 09/053,343

[22] Filed: Apr. 1, 1998

[51] Int. Cl.[6] .................................................. H03F 3/45
[52] U.S. Cl. ................................................ 330/69; 330/308
[58] Field of Search .............................. 330/69, 109, 252, 330/260, 294, 308

[56] References Cited

U.S. PATENT DOCUMENTS

| | | | |
|---|---|---|---|
| 3,500,223 | 3/1970 | Thurnell | 330/30 |
| 5,329,115 | 7/1994 | Lim | 250/214 R |
| 5,424,675 | 6/1995 | Matsushita | 327/558 |
| 5,517,035 | 5/1996 | Krijntjes | 250/551 |
| 5,864,416 | 1/1999 | Williams | 359/189 |

*Primary Examiner*—Benny Lee
*Assistant Examiner*—Henry Choe
*Attorney, Agent, or Firm*—F. Chau & Associates, LLP

[57] ABSTRACT

A low noise, high gain-bandwidth preamplifier is formed which employs positive, capacitive feedback to compensate the frequency response of the amplifier for an applied input capacitance. The circuit includes a differential amplifier circuit with conventional resistive, negative feedback. The circuit further includes a pair of compensating capacitors coupled across the amplifier, providing positive feedback which compensates for an applied input capacitance. The preamplifier circuit provides a high gain-bandwidth along with enhanced noise performance.

4 Claims, 3 Drawing Sheets

LOW NOISE, BANDWIDTH COMPENSATED TRANSIMPEDANCE AMPLIFIER

BACKGROUND OF THE INVENTION

1. Field of the Invention

The present invention relates to signal amplifiers and, more particularly, to a low noise transimpedance preamplifier circuit employing capacitive feedback to compensate for an undesired bandwidth roll-off.

2. Description of the Related Art

Low noise preamplifier circuits are commonly used in instrumentation and communication applications to provide signal gain with minimal added noise, thus maintaining a high signal-to-noise ratio. The smaller the desired signal which is applied to the amplifier, the more critical it is that the signal-to-noise ratio is properly maintained.

A typical preamplifier circuit for use in an optical receiver circuit front end is illustrated in FIG. 1. Referring to FIG. 1, a photodetector 10 is coupled to an input of an amplifier circuit 12. The photodetector 10 includes a photodiode 10a having an associated parasitic capacitance 10b. The value of the parasitic capacitance 10b is proportional to the size of the photodetector 10. When connected to the preamplifier circuit, the capacitor 10b creates a loading effect which limits the frequency response of the preamplifier circuit.

The circuit of FIG. 1 includes a resistor 14, which is connected across the amplifier circuit 12 from the input to the output. In transimpedance amplifiers, the resistor 14 is referred to as a transimpedance resistance and, in part, determines the gain and noise properties of the preamplifier circuit 12. By reducing the value of the resistor 14, the loading effects of capacitor 10b can be reduced. However, reducing the value of the transimpedance resistor 14 also results in increased noise which reduces the signal-to-noise ratio, and therefore, the sensitivity, of the preamplifier circuit 12.

To avoid the undesired effects associated with reducing the transimpedance resistor 14, other circuits have been used which employ post-amplification equalization. Such circuit topologies are generally referred to as high-impedance amplifiers, or integrating front end amplifiers. These circuits employ a very high impedance input circuit which, when combined with an input capacitor such as 10b, results in an integration function. The combination of the high input impedance and parasitic capacitor 10b severely limits the frequency response of these amplifiers. Thus, an equalization circuit must be employed after the integrating amplifier in order to restore the required frequency response. In order to be effective, the time constants of the equalization circuit must be precisely selected and maintained. Therefore, this technique is complicated and expensive to implement, therefore, rendering it prohibitive for many applications.

Accordingly, there remains a need for a low noise preamplifier circuit which employs a simple circuit topology to compensate the frequency response of the amplifier in the presence of an applied input capacitance.

OBJECTS AND SUMMARY OF THE INVENTION

It is an object of the present invention to provide a low noise, bandwidth compensated preamplifier circuit.

It is another object of the present invention to provide a method for compensating the frequency response of a preamplifier having a capacitive input load which does not degrade the signal-to-noise performance of the preamplifier circuit.

It is a further object of the present invention to provide a low noise, bandwidth compensated preamplifier circuit which does not require post-amplification equalization.

In accordance with one form of the present invention, a low noise transimpedance preamplifier circuit is formed which includes a differential amplifier having a first input terminal, a second input terminal, a first output terminal and a second output terminal. The circuit further includes a first resistor which is connected between the first input terminal and the first output terminal and provides negative feedback. A second resistor is also included which is connected between the second input terminal and the second output terminal, also providing negative feedback.

The circuit further includes a first capacitor which is connected between the first input terminal of the differential amplifier and the second output terminal of the amplifier. Finally, the circuit includes a second capacitor which is connected between the second input terminal of the differential amplifier and the first output terminal. The first capacitor and second capacitor provide positive feedback which compensates the amplifier's frequency response for an input capacitance applied across the first and second input terminals of the differential amplifier.

In a method for compensating the frequency response of a preamplifier circuit in accordance with the present invention, compensating feedback capacitors are selected to neutralize the effect of an applied input capacitance. Initially, the gain of the preamplifier (A), the magnitude of the applied input capacitance ($C_i$) and the desired magnitude of the feedback resistance ($R_f$) are determined. Then, a desired operating bandwidth (B) is selected and finally, the value of the first and second capacitors is calculated and based on the equation:

$$C_p \approx \frac{2C_i}{A} - \frac{1}{2\pi BR_f}$$

These and other objects, features and advantages of the present invention will become apparent from the following detailed description of illustrative embodiments thereof, which is to read in connection with the accompanying drawings.

BRIEF DESCRIPTION OF THE DRAWINGS

The invention will be described in detail in the following description of preferred embodiments with reference to the following figures, wherein.

DETAILED DESCRIPTION OF THE PREFERRED EMBODIMENTS

Figure 2:
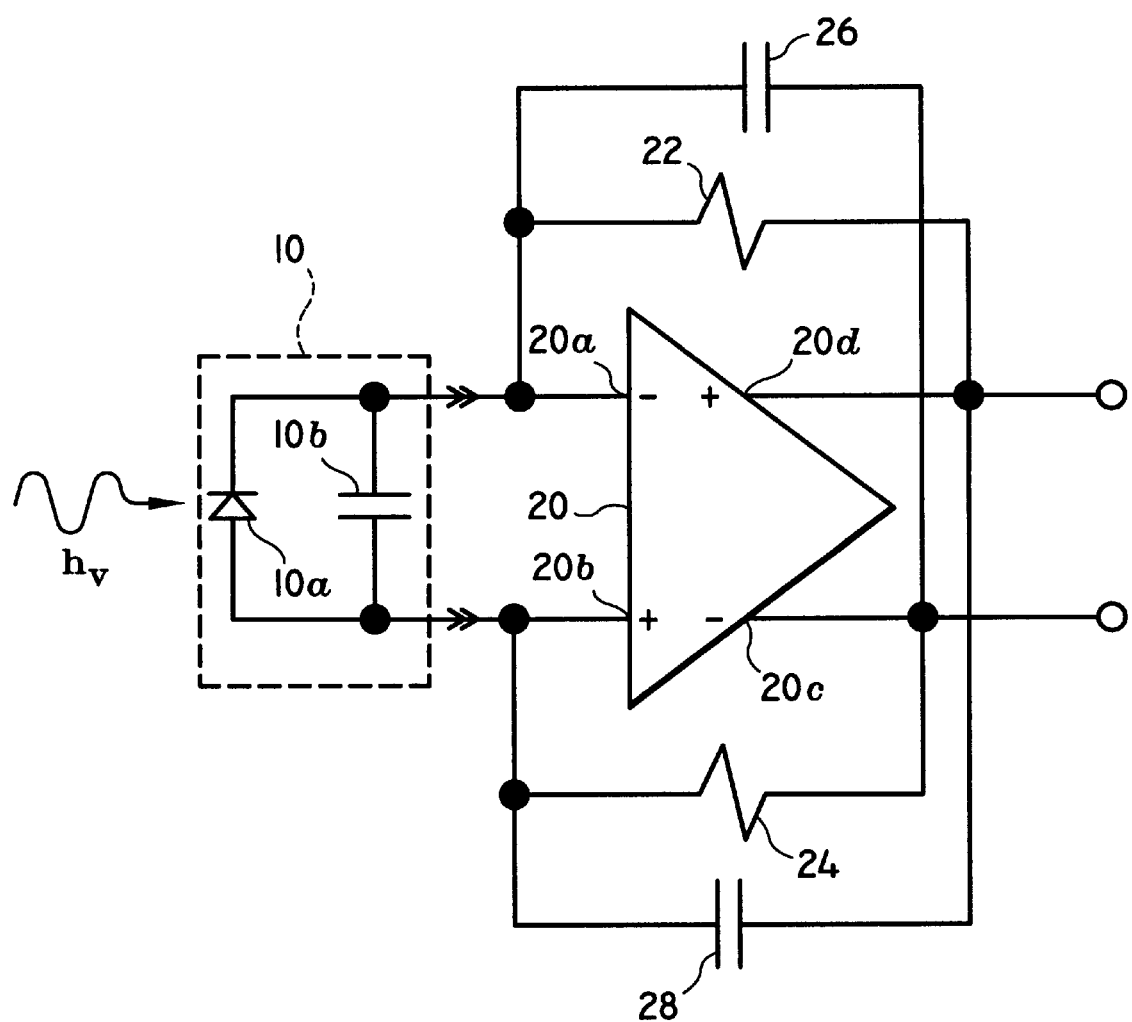
FIG. 2 is a simplified schematic diagram of a compensated differential transimpedance amplifier, formed in accordance with the present invention.
Figure 3:
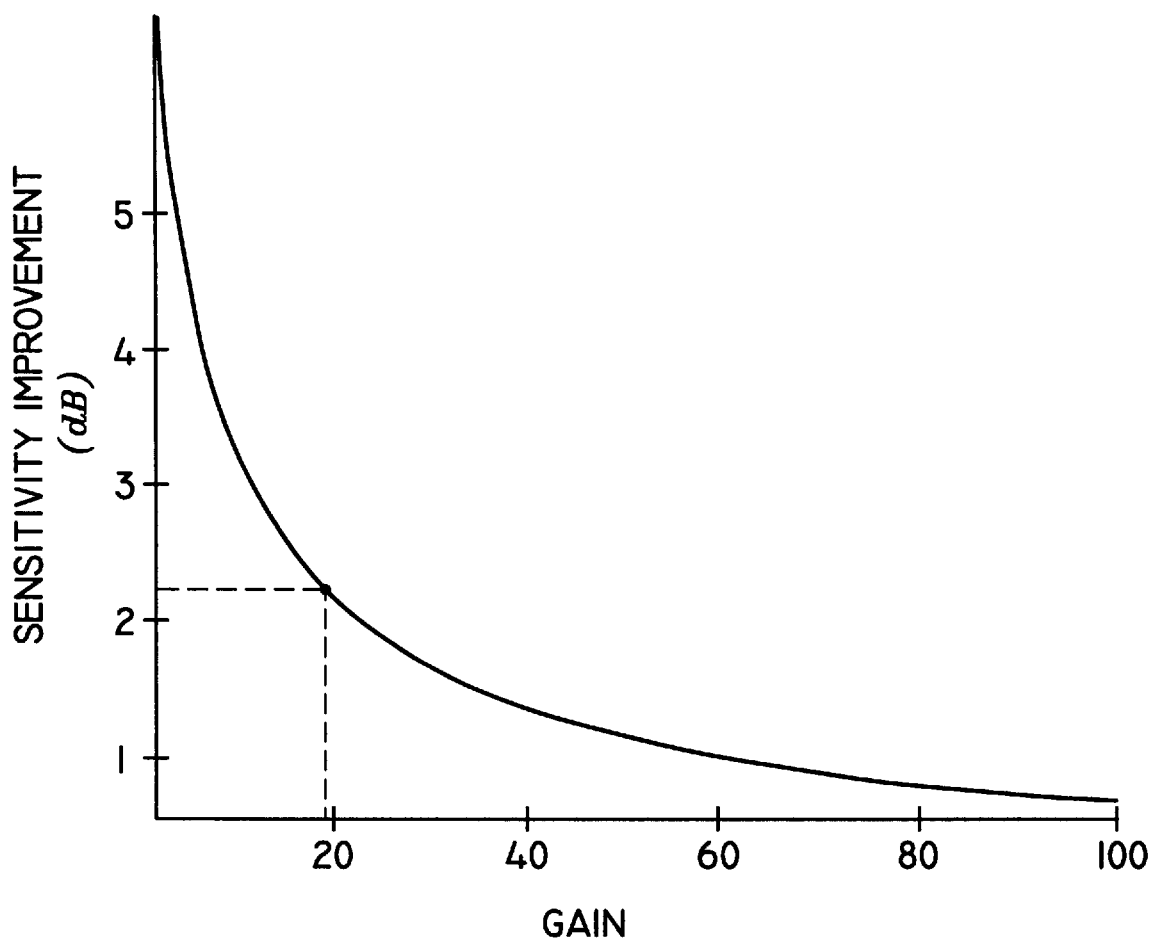
FIG. 3 is a graph illustrating expected sensitivity improvement versus amplifier gain which is achieved by the present invention.

Referring to FIG. 2, a compensated transimpedance amplifier circuit formed in accordance with the present invention is shown. The circuit is formed around a differential amplifier circuit 20. The differential amplifier circuit 20 includes a complimentary input having an inverting input terminal 20a and a noninverting input terminal 20b. The differential amplifier circuit 20 also includes a complimentary output having an inverting output terminal (out of phase) 20c and a noninverting output (in phase) terminal 20d. The inverting output terminal 20c presents signals 180° degrees out of phase with respect to the noninverting output terminal 20c. The differential amplifier circuit 20 can be formed using either bipolar technology or FET technology.

The circuit further includes a first resistor 22 and a second resistor 24. The first resistor 22 is connected from the inverting input terminal 20a to the noninverting output terminal 20d of the differential amplifier circuit 20. Similarly, the second resistor 24 is connected from the noninverting input terminal 20d to the inverting output terminal 20c of the differential amplifier circuit 20. The first resistor 22 and second resistor 24 are preferably selected to have an equal value. The calculation of this value will be derived in a following section.

The preamplifier circuit formed in accordance with the present invention also includes a first capacitor 26 and a second capacitor 28. The first capacitor 26 is coupled from the inverting input terminal 20a to the inverting output terminal 20c. The second capacitor 28 is coupled from the noninverting input terminal 20b to the noninverting output terminal 20d. The first capacitor 26 and second capacitor 28 are selected to compensate for the loading effects of an applied input capacitance 10b which would otherwise diminish the bandwidth of the amplifier circuit.

Figure 1:
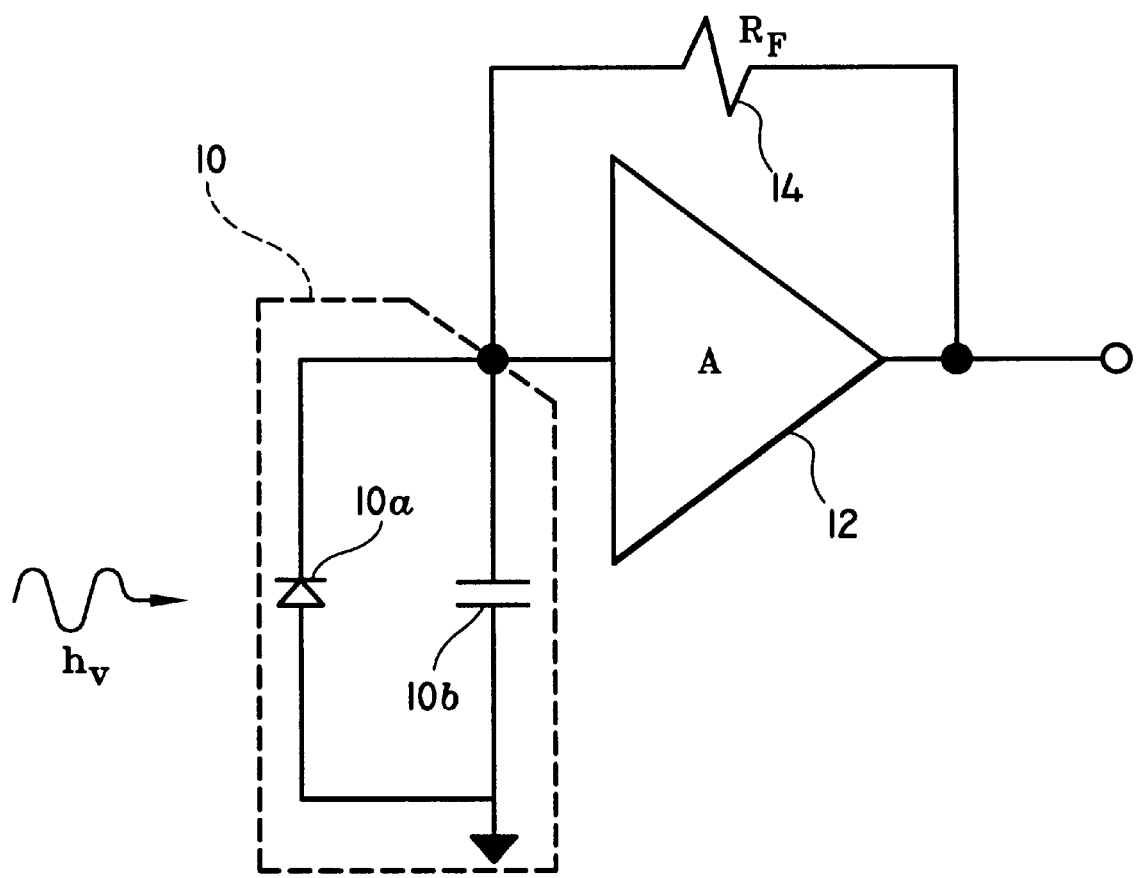
FIG. 1 is a simplified schematic diagram of a transimpedance amplifier known in the prior art.

As stated in connection with FIG. 1, the addition of a capacitive load to the input of a transimpedance amplifier results in an undesired roll-off of the amplifier's bandwidth. This bandwidth degradation can be compensated for by reducing the value of the transimpedance resistance (resistors 22, 24) that are in feedback across the amplifier. However, such a reduction in the transimpedance resistance also results in an increase in the thermal noise of the circuit. This results in a reduction of the signal to noise ratio of the circuit and reduced sensitivity. To avoid this undesired effect, the present invention uses feedback capacitors 26, 28 which are selected to substantially neutralize the bandwidth degradation resulting from the input capacitance 10b without requiring a reduction in the value of the transimpedance resistors 22, 24. This results in a high gain-bandwidth response and low noise performance.

The first capacitor 26 and second capacitor 28 are selected to have the same value which is calculated to compensate for an input capacitance to the differential amplifier 20. Referring to the value of both the first capacitor 26 and the second capacitor 28 as $C_p$, the value of the capacitors can be calculated as follows:

$$C_p = \frac{2C_i}{A-1} - \frac{A}{2\pi BR_f(A-1)} \quad \text{EQ. 1}$$

where $C_i$ is the magnitude of the input capacitance 10b, A is the open-loop gain of the differential amplifier 20, B is the desired 3db bandwidth of the amplifier circuit and $R_f$ is the value of the transimpedance resistors 22,24. For values of gain significantly greater than unity, equation 1 can be approximated by:

$$C_p \approx \frac{2C_i}{A} - \frac{1}{2\pi BR_f} \quad \text{EQ. 2}$$

In order to appreciate the effect of the addition of feedback capacitors 26, 28, the following derivation is provided.

The signal across the output 20c, 20d of the preamplifier 20 can be represented quite generally by the equation:

$$V_{12} = -Av_{12} + v_A \quad \text{EQ. 3}$$

where $v_A$ is the amplifier output noise, A is the open loop gain, and v12 is the differential voltage applied across the input 20a,20b of the differential amplifier 20. For a differential bipolar amplifier $v_A$ is primarily due to the base spreading resistance and the collector current, and can be expressed as:

$$(V_A)^2 = A^2[8\, kTr_{bb} + 4(kT)^2/qI_c] \quad \text{EQ. 4}$$

The amplifier also includes input noise, $i_\alpha$, which is due to input currents and the transimpedance resistors, $R_f$ (22, 24). The input noise, $i_\alpha$ can be expressed by the equation:

$$(i_\alpha)^2 = 2qI_S + \left(4\frac{qI_E}{\beta}\right) + \left(8\frac{kT}{R_f}\right) \quad \text{EQ. 5}$$

where $r_{bb}$ is the base spreading resistance, $\beta$ is the DC current gain, $I_S$ is an average DC photocurrent or detector leakage current at the input of the differential amplifier 20 and $I_E$ and $I_C$ are the emitter and the collector currents respectively for each transistor in the differential pair.

For a simple FET amplifier, $v_A$ is due to thermal noise in the FET channel and is characterized by the equation:

$$\langle V_A \rangle^2 = \frac{8kT\Gamma A^2}{g_m} \quad \text{EQ. 6}$$

where $\Gamma$ is a dimension less parameter, near unity, dependent on the selected FET technology, and $g_m$ is the FET transconductance. For a FET amplifier, the input noise, $i_\alpha$, is due to input currents and the transimpedance resistance (resistors 22, 24):

$$\langle i_\alpha^2 \rangle = 2qI_S + 8\frac{kT}{R_f} \quad \text{EQ. 7}$$

Applying Equation 1 to the circuit in FIG. 2, the output voltage $V_{12}$ can be expressed as:

$$V_{12} = \frac{2R_f[(i_D + i_A) - \dfrac{V_A\left(1 + 2j\omega R_f\left(C_i + \dfrac{C_p}{2}\right)\right)}{2AR_f}]}{1 + \dfrac{1}{A} + \dfrac{2j\omega R_f}{A}C_{\mathit{eff}}} \quad \text{EQ. 8}$$

where $C_i$ is the magnitude of the input capacitor 10b, $C_p$ is the value of the capacitors 26, 28, Rf is the value of the resistors 22, 24 and $C_{\mathit{eff}} = C_i - ((A-1)C_p)/2$. From equation 8, the frequency response of the circuit of FIG. 2 is shown to be equivalent to that of a traditional transimpedance amplifier, with the input capacitance replaced by the term $C_{\mathit{eff}}$. Notice that the term $(A-1)C_p/2$ of $C_{\mathit{eff}}$ acts to cancel the bandwidth limiting effect of the input capacitance, $C_i$. Accordingly, for a required bandwidth, a larger value of $R_F$ (resistors 22, 24) can be used, thus improving the noise performance of the preamplifier.

Neglecting the frequency dependence of A, a desired bandwidth, B, requires a transimpedance resistance (resistors 22,24) of:

$$R_f = \frac{A}{(2\pi B)(2C_i - (A-1)C_p)} \qquad \text{EQ. 9}$$

From equation 9, it is clear that the required transimpedance resistance is increased by a factor of $1/(1-((A-1)C_p)/(2C_i))$ as a result of the capacitors 26,28.

The noise current, referred to the photodetector, can be stated as:

$$i_N = i_A - \frac{v_A}{2AR_F}[1 + 2j\omega R_f(C_i + C_p/2)] \qquad \text{EQ. 10}$$

or in terms of the mean square values:

$$\langle i_N^2 \rangle = \langle i_A^2 \rangle + \frac{\langle v_A^2 \rangle}{4A^2 R_f^2}(1 + 4\omega^2 R_f^2 C_i^2) \qquad \text{EQ. 11}$$

where it is assumed that $C_p \ll 2C_i$. Notice that as $R_f$ becomes large, the component of $I_N$ that represents the noise due to the transimpedance resistance goes to zero and we arrive at the same expression as for the noise in an integrating design (at least to the order of $C_p/2C_i$). In other words, the compensation capacitors 26, 28 perform the same function as the equalizing circuit used with a conventional integrating design, with a far simpler circuit implementation.

Derivation of Noise Optimization

The effects of the compensation capacitors 26, 28, can be further appreciated by evaluating the optimum noise performance of a preamplifier circuit formed in accordance with the present invention.

For a bipolar circuit implementation, the noise can be stated as:

$$\langle i_N^2 \rangle = 2q\left(I_S + \frac{2I_E}{\beta}\right) + \frac{8kT}{R_f} + \frac{\left(8kTr_{bb} + \frac{4(kT)^2}{qI_C}\right)}{4R_f^2}(1 + 4\omega^2 R_f^2 C_i^2) \qquad \text{EQ. 12}$$

Substituting the equation of $R_f$ determined in EQ. 8 and integrating over the desired bandwidth, we arrive at the expression:

$$\int_0^{2\pi B} \frac{\langle i_N^2 \rangle}{2\pi} d\omega = \qquad \text{EQ. 13}$$

$$2q\left(I_S + 2\frac{I_E}{\beta}\right)B + \frac{32\pi kTB^2 \alpha C_i}{A} + \frac{16\pi^2 B^3}{3}\left(2kTr_{bb} + \frac{(kT)^2}{qI_E}\right)C_i^2$$

where it is assumed that $I_C \approx I_E$ and $C_{cff} \ll AC_i/\text{SQRT}(3)$. The minimum noise point is now found by setting the first derivative of this equation with respect to $I_E$ to zero resulting in:

$$I_E^{\min} = \frac{2kT\pi BC_i \sqrt{\beta/3}}{q} \qquad \text{EQ. 14}$$

Substituting this equation into EQ 13 we arrive at an expression for the optimized noise:

$$\int_0^{2\pi B} \frac{\langle i_N^2 \rangle}{2\pi} d\omega = \qquad \text{EQ. 15}$$

$$\frac{16\pi kTB^2}{\sqrt{3\beta}} \times \left(C_i\left(1 + \frac{\alpha\sqrt{12\beta}}{A}\right) + 2\sqrt{\beta/3}\,\pi r_{bb}BC_i^2\right)$$

The effect of the compensation capacitors 26,28 is contained in the factor $$1 + \alpha 12\beta/A$$

which varies from 1 for complete compensation, to $1+12\beta/A$ for no compensation. The noise reduction possible is clearly greatest when the gain A is small, which is usually the case in low voltage designs where the signal swing is limited. For a voltage swing of 500 mV, $A = q\Delta\backslash V/(KT) \equiv 19$ and, assuming $\beta=100$, the compensation factor, $1+12\beta/A=2.8$. This results in a sensitivity improvement of 2.2 dB. FIG. 2 shows a graph of the possible sensitivity improvement as a function of gain, A, assuming the contribution due to rbb is small and that $\beta=100$.

As will be readily appreciated by those skilled in the art, a compensated differential transimpedance preamplifier formed in accordance with the present invention achieves both a high gain-bandwidth as well as low noise performance. This enhanced performance is achieved using a simple circuit topology which does not require complex post-amplification equalization. As such, the present invention provides a preamplifier circuit which is particularly well-suited for use as a front end preamplifier in an optical receiver system.

Having described preferred embodiments of the present invention, it is noted that modifications and variations can be made by persons skilled in the art in light of the above teachings. It is therefore to be understood that changes may be made in the particular embodiments of the invention disclosed which are within the scope and spirit of the invention as outlined by the appended claims.

What is claimed is:

1. A low noise preamplifier circuit comprising:
   a differential amplifier having a complimentary input and a complimentary output;
   a first resistor and a second resistor, said first resistor and second resistor being coupled across said differential amplifier from input to output, providing negative feedback, said first resistor and second resistor having a substantially equal resistance value; and
   a first capacitor and a second capacitor, said first capacitor and said second capacitor being coupled across said differential amplifier from input to output providing positive feedback, said first capacitor and said second capacitor having a substantially equal capacitance value, said capacitance value being selected to provide bandwidth compensation for an input capacitance applied to said complimentary input, wherein said resistance value is related to said capacitance value by the equation, $CP \approx 2Ci/A - 1/(2\pi B \cdot Rf)$, where Cp is said capacitance value, Ci is the value of the input capacitance, A is a gain of said differential amplifier circuit, B is a selected operating bandwidth and Rf is said resistance value.

2. A low noise preamplifier circuit compensated for an applied input capacitance, the preamplifier comprising:
   an amplifier circuit;
   a first resistor and a second resistor for providing negative, resistive feedback across said amplifier circuit, said first resistor and second resistor having a substantially equal resistance value; and a first capacitor and a second capacitor for providing positive, capacitive feedback across said amplifier circuit, said first capacitor and said second capacitor having a substantially equal capacitance value, wherein said resistance value is related to said capacitance value, said relationship being substantially defined by the equation $CP \approx 2Ci/A-1/(2\pi B \cdot Rf)$, where Cp is said capacitance value, Ci is the value of the input capacitance, A is a gain of said differential amplifier circuit, B is a selected operating bandwidth and RF is said resistance value.

3. A low noise, bandwidth compensated optical front end circuit comprising:

a differential amplifier circuit, said differential amplifier circuit having a first input terminal, a second input terminal, a first output terminal and a second output terminal;

a photodetector having an associated capacitance value, said optical detector being operatively coupled to said first input terminal and said second input terminal of said differential amplifier circuit;

a first resistor, said first resistor connected between said first input terminal and said first output terminal;

a second resistor, said second resistor connected between said second input terminal and said second output terminal;

a first capacitor, said first capacitor being connected between said first output terminal and said second output terminal; and a second capacitor, said second capacitor being connected between said second input terminal and said first output terminal, said first capacitor and said second capacitor having a substantially equal capacitance value, said value selected to compensate the effect of the capacitance value associated with said photodetector, wherein the value of said first resistor and said second resistor is related to the value of said first capacitor and said second capacitor, said relationship being substantially defined by the equation $CP \approx 2Ci/A-1(2\pi B \cdot Rf)$, where Cp is the value of said first and second capacitor, Ci is the value of the capacitance of said photodetector, A is a gain of said differential amplifier circuit, B is a selected operating bandwidth and Rf is the value of said first and second resistors.

4. A method of compensating an amplifier circuit in the presence of an applied input capacitance comprising the steps:

determining a gain of the amplifier, a transimpedance resistance value in feedback with the amplifier and a value of the input capacitance;

selecting a desired operating bandwidth of the amplifier; and calculating a value of at least one compensation capacitor applied in a positive feed back arrangement across the amplifier by applying a formula, $CP \approx 2Ci/A-1 (2\pi B \cdot Rf)$, where Cp is the value of said compensation capacitor, Ci is the value of the input capacitance, A is a gain of the amplifier circuit, B is the selected bandwidth and Rf is the value of the transimpedance resistance.

* * * * *